United States Patent
Su

(10) Patent No.: US 12,388,008 B2
(45) Date of Patent: Aug. 12, 2025

(54) SEMICONDUCTOR INTERCONNECT STRUCTURE WITH BOTTOM SELF-ALIGNED VIA LANDING

(71) Applicant: Taiwan Semiconductor Manufacturing Company Limited, Hsinchu (TW)

(72) Inventor: Yi-Nien Su, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 523 days.

(21) Appl. No.: 17/376,940

(22) Filed: Jul. 15, 2021

(65) Prior Publication Data
US 2023/0014156 A1    Jan. 19, 2023

(51) Int. Cl.
*H01L 23/522*    (2006.01)
*H01L 21/768*    (2006.01)

(52) U.S. Cl.
CPC .... *H01L 23/5226* (2013.01); *H01L 21/76807* (2013.01); *H01L 21/76831* (2013.01); *H01L 21/76832* (2013.01)

(58) Field of Classification Search
CPC .............. H01L 23/5226; H01L 23/528; H01L 21/76807; H01L 21/76832; H01L 21/76831; H01L 24/19
See application file for complete search history.

(56) References Cited

U.S. PATENT DOCUMENTS

| | | | | |
|---|---|---|---|---|
| 10,290,536 | B2 * | 5/2019 | Lu .................. | H01L 21/76843 |
| 2018/0019203 | A1 * | 1/2018 | Conti ................ | H01L 27/088 |
| 2018/0096850 | A1 * | 4/2018 | Lu .................... | H01L 21/76832 |
| 2018/0315654 | A1 * | 11/2018 | Briggs .............. | H01L 21/76897 |
| 2021/0305090 | A1 * | 9/2021 | Cheng .............. | H01L 21/76813 |
| 2021/0375749 | A1 * | 12/2021 | Yang ................ | H01L 21/76807 |
| 2021/0375751 | A1 * | 12/2021 | Dai .................. | H01L 23/53295 |

* cited by examiner

*Primary Examiner* — Zandra V Smith
*Assistant Examiner* — John M Parker
(74) *Attorney, Agent, or Firm* — FOLEY & LARDNER LLP

(57) ABSTRACT

A semiconductor structure and method for forming a semiconductor structure includes formation of a recess in a metal layer during the fabrication process to provide process improvements and a conductive via with reduced contact resistance. The semiconductor structure includes a dielectric layer, a metal layer, an etch stop layer, and a conductive via. The top surface of the dielectric layer extends above a top surface of the metal layer, and a bottom surface of the conductive via extends below the top surface of the dielectric layer.

20 Claims, 12 Drawing Sheets

SEMICONDUCTOR INTERCONNECT STRUCTURE WITH BOTTOM SELF-ALIGNED VIA LANDING

BACKGROUND

Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
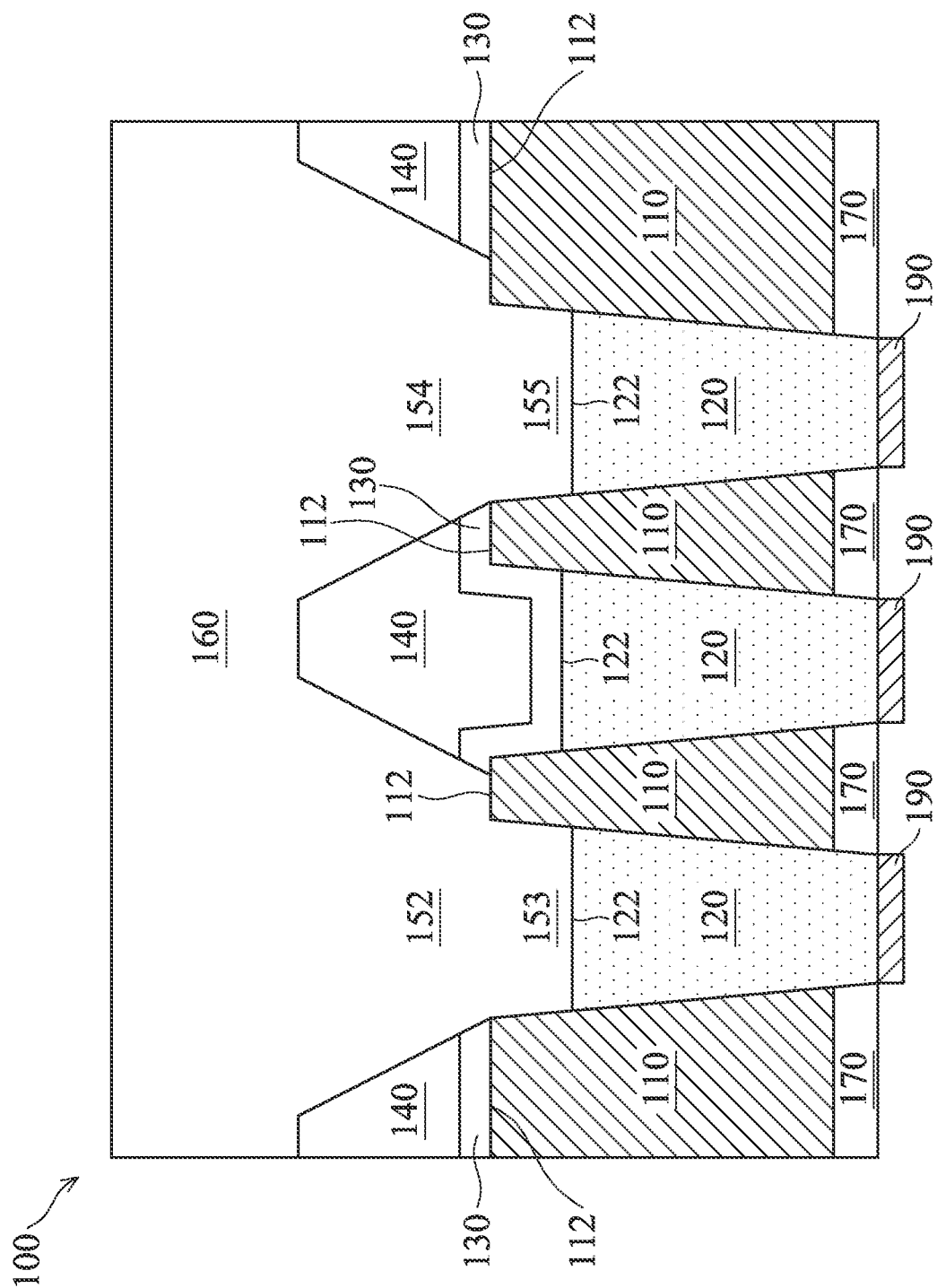
FIG. 1 illustrates a cross section of an example semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure and method of fabricating a semiconductor structure includes formation of a recess in a metal layer during the fabrication process to provide process improvements and a conductive via with reduced contact resistance. The semiconductor structure includes a dielectric layer, a metal layer, an etch stop layer, and a conductive via. The top surface of the dielectric layer extends above a top surface of the metal layer, and a bottom surface of the conductive via extends below the top surface of the dielectric layer. The etch stop layer can be formed using a thin layer of aluminum oxide and can be partially removed using a wet etching process during the fabrication process. The techniques discussed in the present disclosure can be used to reduce variations in the widths of conductive vias and to enlarge the widths of conductive vias, as well as to control overlap. Further, the techniques discussed herein can be used to provide reduced contact resistance associated with conductive vias as a result of improved landing control of conductive vias, as well as to control metal leak space. The techniques discussed herein can be especially useful in applications with smaller semiconductor devices, such as applications where the pitch is less than 20 nanometers.

Referring now to FIG. 1, a cross section of an example semiconductor structure 100 is shown, in accordance with some embodiments. Semiconductor structure 100 is generally an interconnect structure that provides electrical connections between individual semiconductor devices (e.g. transistors, capacitors, etc.) and conductive metal layers in an integrated circuit. Semiconductor structure 100 can generally provide improvements in terms of reduced contact resistance and improved via landing, as discussed in more detail below. Semiconductor structure 100 can provide improvements in terms of both yield and performance, and can be implemented in a variety of devices and circuits including both memory and processing devices and circuits.

Semiconductor structure 100 is shown to include a first dielectric layer 110. As shown, the first dielectric layer 110 generally includes a plurality of vertical portions spaced apart from each other. The first dielectric layer 110 can be formed using a variety of suitable deposition processes, including physical vapor deposition, chemical vapor deposition, electrochemical deposition, atomic layer deposition, and other suitable processes and combinations thereof. The first dielectric layer 110 can be formed using a variety of suitable materials, including silicon dioxide, silicon oxynitride, silicon nitride, silicon carbon nitride, silicon oxycarbonitride, hafnia, tantalum nitride, and other suitable materials and combinations thereof. The first dielectric layer 110 generally provides electrical isolation between different layers of semiconductor structure 100, as discussed in detail herein.

Semiconductor structure 100 is also shown to include a first metal layer 120. As shown, the first metal layer 120 is formed adjacent the first dielectric layer 110. The first metal layer 120 can serve as the first metal layer in an interconnect structure of an integrated circuit, and can thereby be electrically coupled to one or more contacts 190 of one or more semiconductor devices, such as contacts formed on gate, source, and/or drain terminals of individual transistors. The first metal layer 120 can be formed using a variety of suitable deposition and filing processes, including physical vapor deposition, chemical vapor deposition, electrochemical deposition, atomic layer deposition, and other suitable processes and combinations thereof. The first metal layer 120 can be formed using a variety of suitable materials, including ruthenium, tungsten, cobalt, copper, and other suitable materials and combinations thereof. As illustrated in FIG. 1, a top surface 112 of the first dielectric layer 110 extends above a top surface 122 of the first metal layer 120. In some embodiments, the top surface 112 of the first dielectric layer 110 extends above the top surface 122 of the first metal layer 120 by a magnitude ranging from 2 nanometers to 10 nanometers, however magnitudes outside of this range are also contemplated. The extension of the top surface 112 of the first dielectric layer 110 above the top surface 122 of the first metal layer 120 in this manner can provide a variety of advantages, as discussed herein.

Semiconductor structure 100 is also shown to include an etch stop layer 130. As shown, etch stop layer 130 is formed adjacent the first dielectric layer 110, the first metal layer 120, a second dielectric layer 140, a conductive via 152, and a conductive via 154 (discussed in more detail below). In some embodiments, etch stop layer 130 is formed using aluminum oxide, however other suitable materials including silicon nitride, silicon carbide, silicon carbonitride, and various combinations thereof can also be used to form etch stop layer 130. Etch stop layer 130 can be formed using a variety of suitable deposition processes, including physical vapor deposition, chemical vapor deposition, electrochemical deposition, atomic layer deposition, and other suitable processes and combinations thereof. Use of aluminum oxide to form etch stop layer 130 can provide high etch selectivity and conformity especially when etch stop layer 130 is a thin layer. In some embodiments, etch stop layer 130 is rather thin as a thickness of etch stop layer 130 ranges from 1 nanometer to 15 nanometers, however thicknesses outside of this range are also contemplated. The high etch selectivity of etch stop layer 130 can facilitate improvements in the formation of various other layers within semiconductor structure 100, such as the second dielectric layer 140 and thereby conductive via 152 and conductive via 154 (discussed in detail below). As illustrated in FIG. 1, portions of etch stop layer 130 are removed in strategic areas such the conducive via 152 and conductive via 154 can be appropriately landed on the first metal layer 120.

Semiconductor structure 100 is also shown to include a second dielectric layer 140. As shown, the second dielectric layer 140 generally includes a plurality of different portions spaced apart from each other and strategically formed within semiconductor structure 100. The second dielectric layer 140 can be formed using a variety of suitable deposition processes, including physical vapor deposition, chemical vapor deposition, electrochemical deposition, atomic layer deposition, and other suitable processes and combinations thereof. The second dielectric layer 140 can be formed using a variety of suitable materials, including silicon dioxide, silicon oxynitride, silicon nitride, silicon carbon nitride, silicon oxycarbonitride, hafnium oxide, tantalum nitride, and other suitable materials and combinations thereof. The second dielectric layer 140 generally provides electrical isolation between different layers of semiconductor structure 100, as discussed in detail herein.

Semiconductor structure 100 is also shown to include a conductive via 152 and a conductive via 154. As shown, conductive via 152 and conductive via 154 are formed adjacent the first dielectric layer 110, the first metal layer 120, etch stop layer 130, the second dielectric layer 140, and a second metal layer 160 (discussed in more detail below). Conductive via 152 and conductive via 154 generally provide electrical connections between the first metal layer 120 and the second metal layer 160. Conductive via 152 and conductive via 154 can be formed using a variety of suitable deposition and filing processes, including physical vapor deposition, chemical vapor deposition, electrochemical deposition, atomic layer deposition, and other suitable processes and combinations thereof. Conductive via 152 and conductive via 154 can be formed using a variety of suitable materials, including ruthenium, tungsten, cobalt, copper, and other suitable materials and combinations thereof. As illustrated in FIG. 1, a bottom surface 153 of conductive via 152 and a bottom surface 155 of conductive via 154, respectfully, extends below the top surface 112 of the first dielectric layer 110. The extension of the bottom surface 153 of conductive via 152 and the bottom surface 155 of conductive via 154, respectfully, below the top surface 112 of the first dielectric layer 110 in this manner can provide a variety of advantages, as discussed herein.

Semiconductor structure 100 is also shown to include a second metal layer 160. As shown, the second metal layer 160 is formed adjacent the second dielectric layer 140, conductive via 152, and conductive via 154. The second metal layer 160 can serve as the second metal layer in an interconnect structure of an integrated circuit, and can thereby be electrically coupled to the first metal layer 120 through conductive via 152 and conductive via 154. The second metal layer 160 can be formed using a variety of suitable deposition and filing processes, including physical vapor deposition, chemical vapor deposition, electrochemical deposition, atomic layer deposition, and other suitable processes and combinations thereof. The second metal layer 160 can be formed using a variety of suitable materials, including ruthenium, tungsten, cobalt, copper, and other suitable materials and combinations thereof.

Semiconductor structure 100 is also shown to include an insulating layer 170. Insulating layer 170 is formed adjacent the first dielectric layer 110. Insulating layer 170 can be implemented as an etch stop layer similar to etch stop layer 130, for example. Insulating layer 170 can be formed using a variety of suitable materials including silicon nitride, silicon carbide, silicon carbonitride, and various combinations thereof. Insulating layer 170 generally has a higher etch selectivity than the first dielectric layer 110 and can be used to protect different layers such as the first dielectric layer 110 and the first metal layer 120.

Figure 2A:
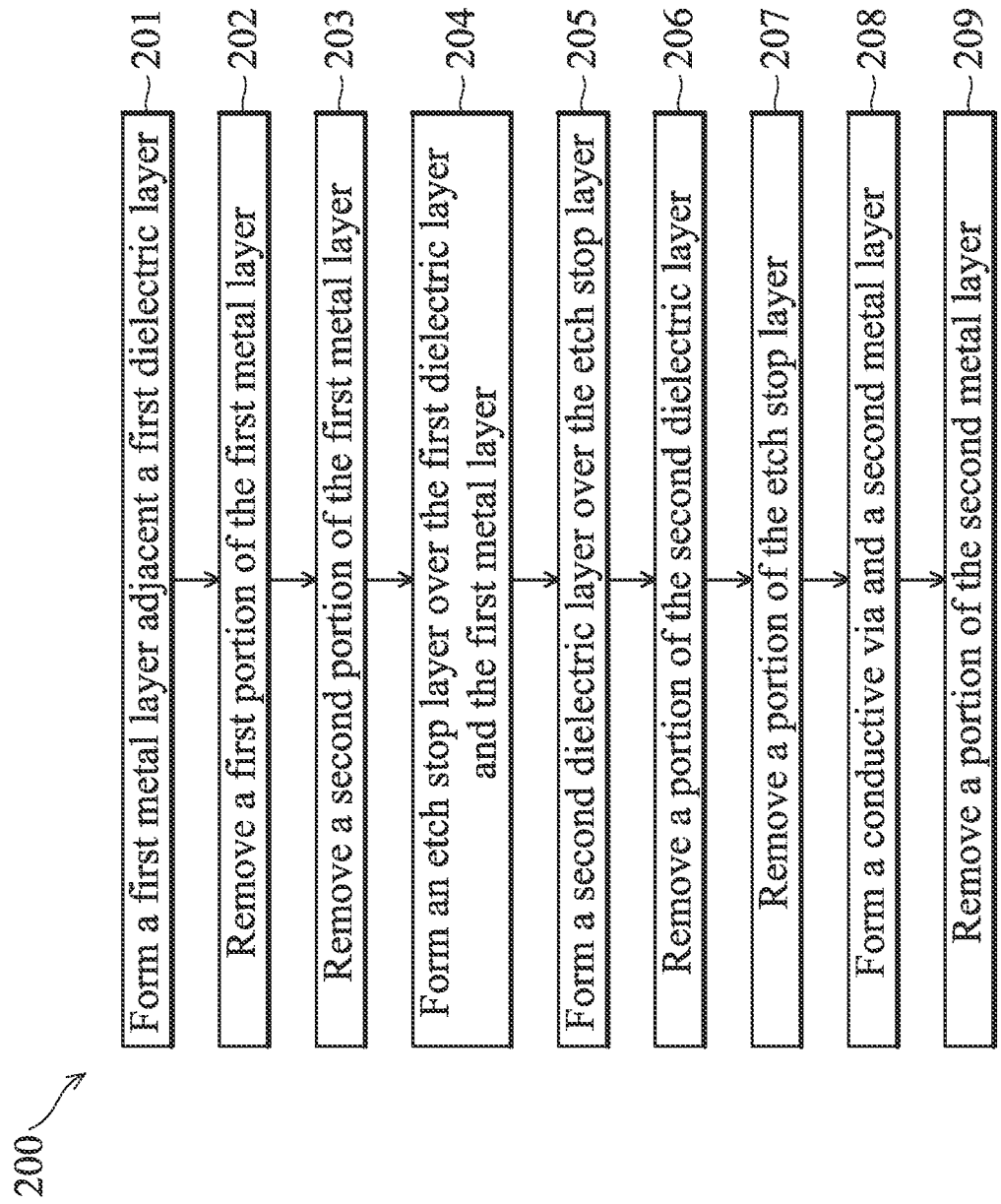
FIG. 2A is a flow chart illustrating an example process for fabricating the semiconductor structure of FIG. 1, in accordance with some embodiments.

Referring now to FIG. 2A, a flow diagram illustrating an example process 200 for fabricating semiconductor structure 100 is shown, in accordance with some embodiments. FIGS. 2B-2J illustrate cross section of semiconductor structure 100 at each step in process 200. Process 200 generally includes formation of a recess in metal layer 120, and forming etch stop layer 130 within the recess to create a bottom self-aligned via landing. Process 200 can be used to reduce variations in the widths of conductive via 152 and conductive via 154 and to enlarge the widths of conductive via 152 and conductive via 154, and to control overlap. Further, process 200 can be used to provide reduced contact resistance associated with conductive via 152 and conductive via 154 as a result of improved landing of conductive via 152 and conductive via 154 on metal layer 120. Process 200 can also be used control metal leak space associated with semiconductor structure 100. Process 200 can be especially useful in applications with smaller semiconductor devices, such as applications where the pitch is less than 20 nanometers.

Figure 2B:
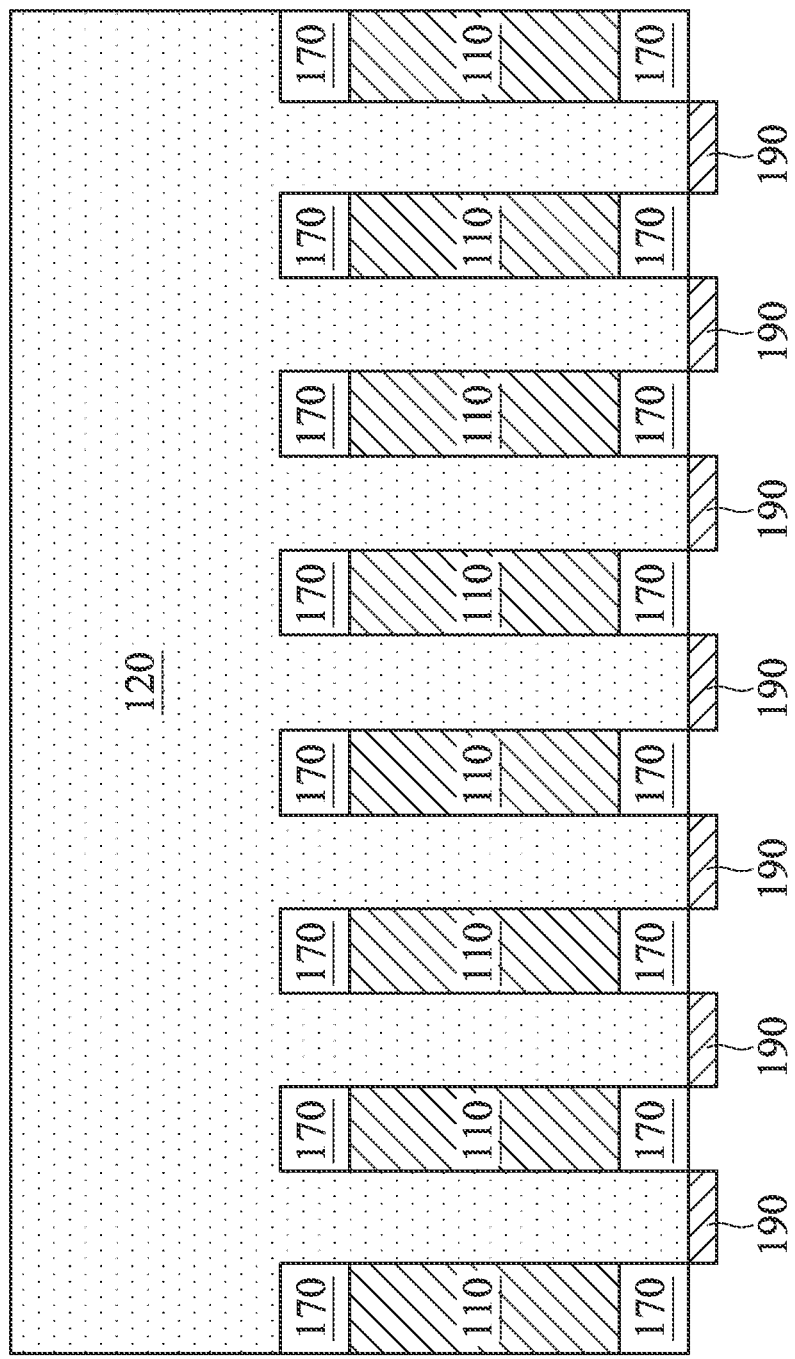
FIGS. 2B-2J illustrate cross section of the semiconductor structure of FIG. 1 at each step in the process of FIG. 2A, in accordance with some embodiments.

At a step 201, a first metal layer is formed adjacent a first dielectric layer (FIG. 2B) and electrically contacts the contacts 190. As illustrated in FIG. 2B, the first metal layer 120 is formed adjacent the first dielectric layer 110. In step 210, the first metal layer 120 can be formed using a variety of suitable deposition and filing processes, including physical vapor deposition, chemical vapor deposition, electrochemical deposition, atomic layer deposition, and other suitable processes and combinations thereof. The first metal layer can be formed using a variety of suitable materials, including ruthenium, tungsten, cobalt, copper, and other suitable materials and combinations thereof. As illustrated in FIG. 2B, the first metal layer is generally formed between vertical portions of the first dielectric layer 110. The first metal layer 110 can serve as the first metal layer in an interconnect structure of an integrated circuit, and can thereby be electrically coupled to one or more contacts 190 of one or more semiconductor devices, such as contacts formed on gate, source, and/or drain terminals of individual transistors.

Figure 2C:
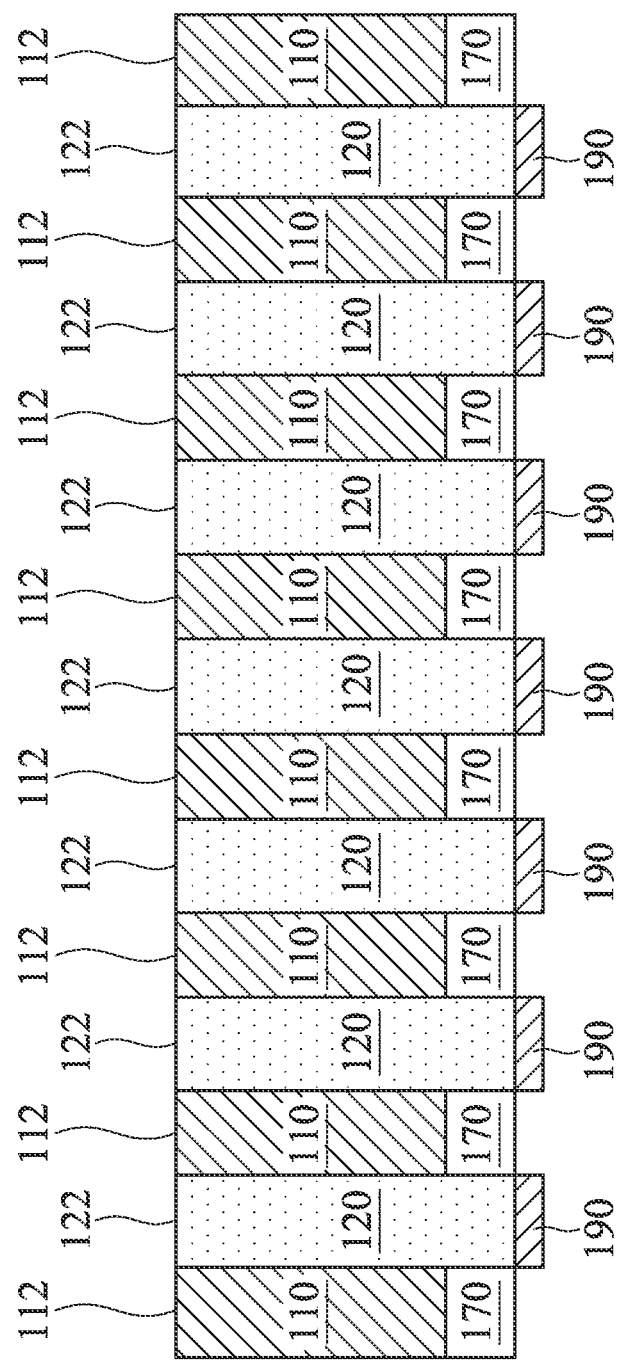

At a step 202, a first portion of the first metal layer is removed (FIG. 2C). As illustrated in FIG. 2C, a first portion of the first metal layer 120 is removed. In some embodiments, the first portion of the first metal layer 120 can be removed using a chemical mechanical planarization (CMP) process, however other suitable processes and combinations thereof can be used to remove the first portion of the first metal layer 120 in step 202. The use of a OH process in step 202 can be used to make the top surface 112 of the first dielectric layer 110 even with the top surface 122 of the first metal layer 120. This smooth surface can facilitate improvements in the formation of semiconductor structure 100.

Figure 2D:
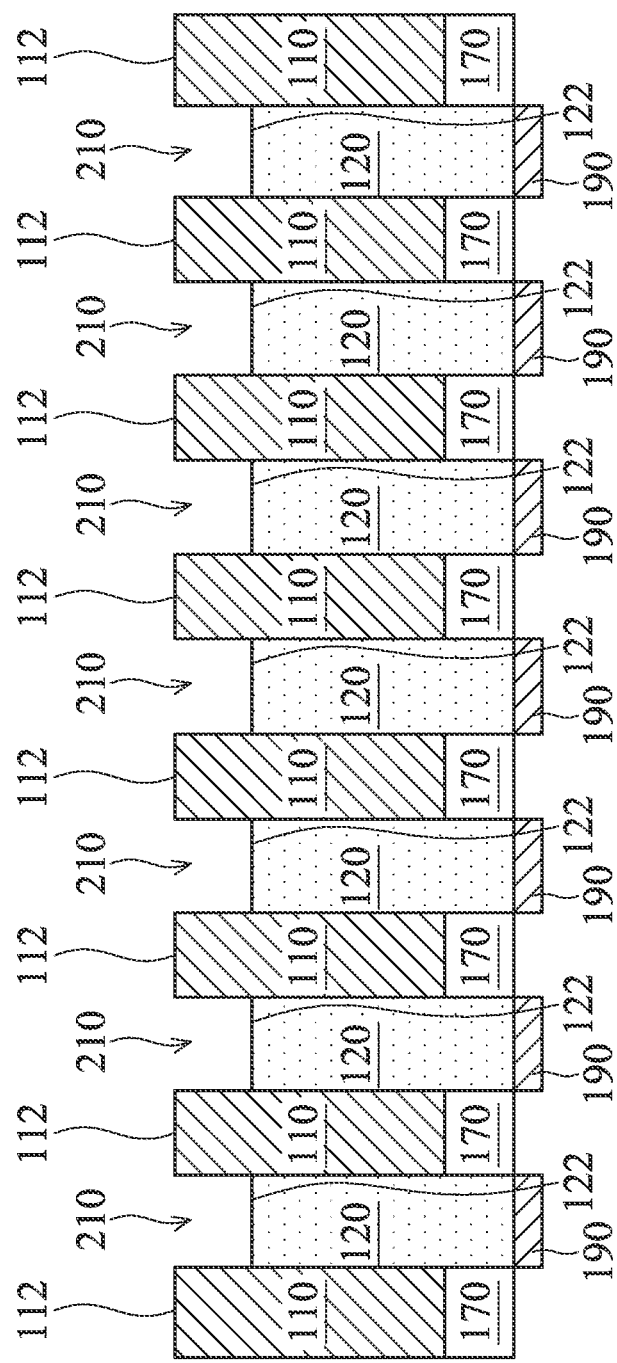

At a step 203, a second portion of the first metal layer is removed (FIG. 2D). As illustrated in FIG. 2D, a second portion of the first metal layer 120 is removed. The second portion of the first metal layer 120 can be removed in step 203 using a variety of suitable processes, including both wet etching and dry etching processes. Wet etchants include, for example, $HNO_3$, $NH_4OH$, HCl, HF. Dry etchants include, for example, $Cl_2$, $SF_6$, and $CF_4$. Further, a variety of suitable etchants can be used in step 203. As illustrated in FIG. 2D, the removal of the second portion of the first metal layer 120 results in a formation of a recess 210 in the first metal layer 210. After step 203, the top surface 112 of the first dielectric layer 110 extends above the top surface 122 of the first metal layer 120. The formation of recess 210 in step 203 ultimately allows for the top surface 112 of the first dielectric layer 110 to extend above the top surface 122 of the first metal layer 120 in the final semiconductor structure 100. In some embodiments, the depth of recess 210 ranges from 2 nanometers to 10 nanometers, however depths outside of this range are also contemplated.

Figure 2E:
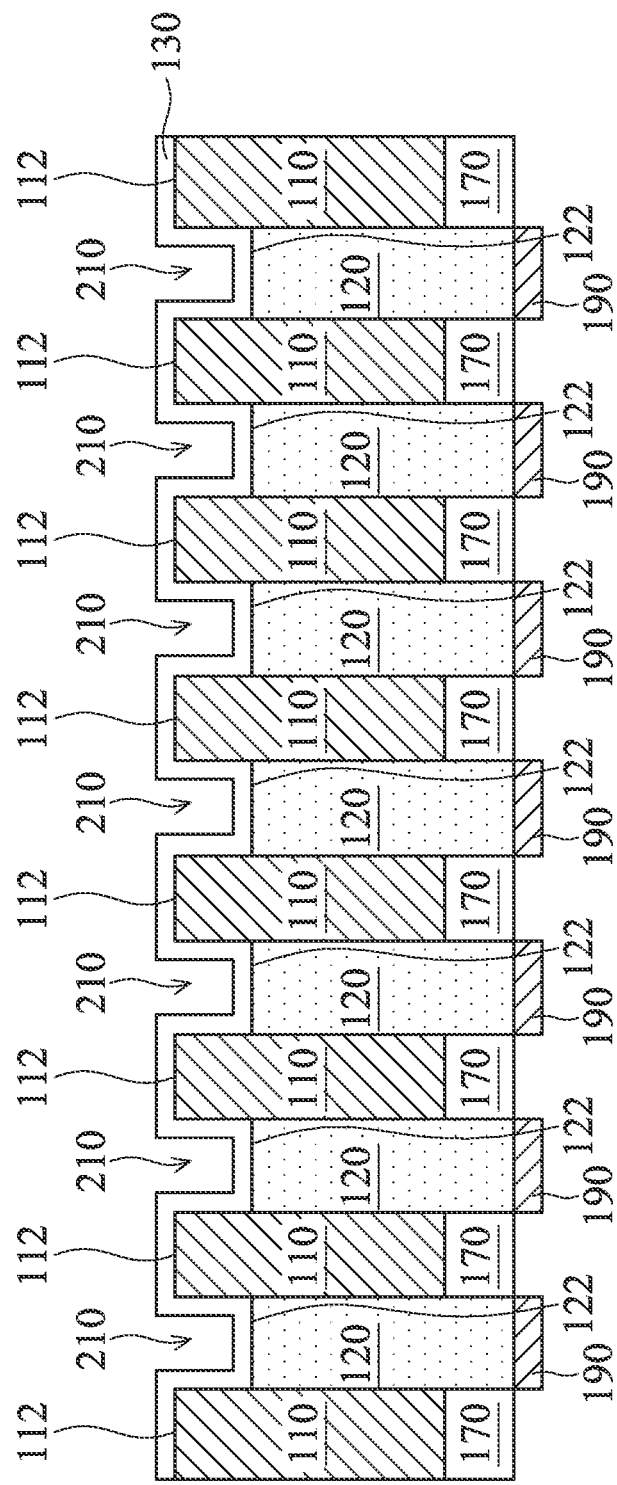

At a step 204, an etch stop layer is formed over the first dielectric layer and the first metal layer (FIG. 2E). As illustrated in FIG. 2E, etch stop layer 130 is formed over the first dielectric layer 110, over the first dielectric layer 120, and within recess 210. Etch stop layer 130 can be formed in step 204 using a variety of suitable processes, including physical vapor deposition, chemical vapor deposition, electrochemical deposition, atomic layer deposition, and other suitable processes and combinations thereof. In some embodiments, using atomic layer deposition to form etch stop layer 130 provides advantages in the fabrication process. In some embodiments, etch stop layer 130 is formed in step 204 using aluminum oxide, however other suitable materials including silicon nitride, silicon carbide, silicon carbonitride, and various combinations thereof can also be used to form etch stop layer 130. Use of aluminum oxide to form etch stop layer 130 can provide high etch selectivity and conformity especially when etch stop layer 130 is a thin layer. In some embodiments, etch stop layer 130 has a thickness that ranges from 1 nanometer to 15 nanometers, however thicknesses outside of this range are also contemplated. As illustrated in FIG. 2E, etch stop layer 130 is also formed within recess 210.

Figure 2F:
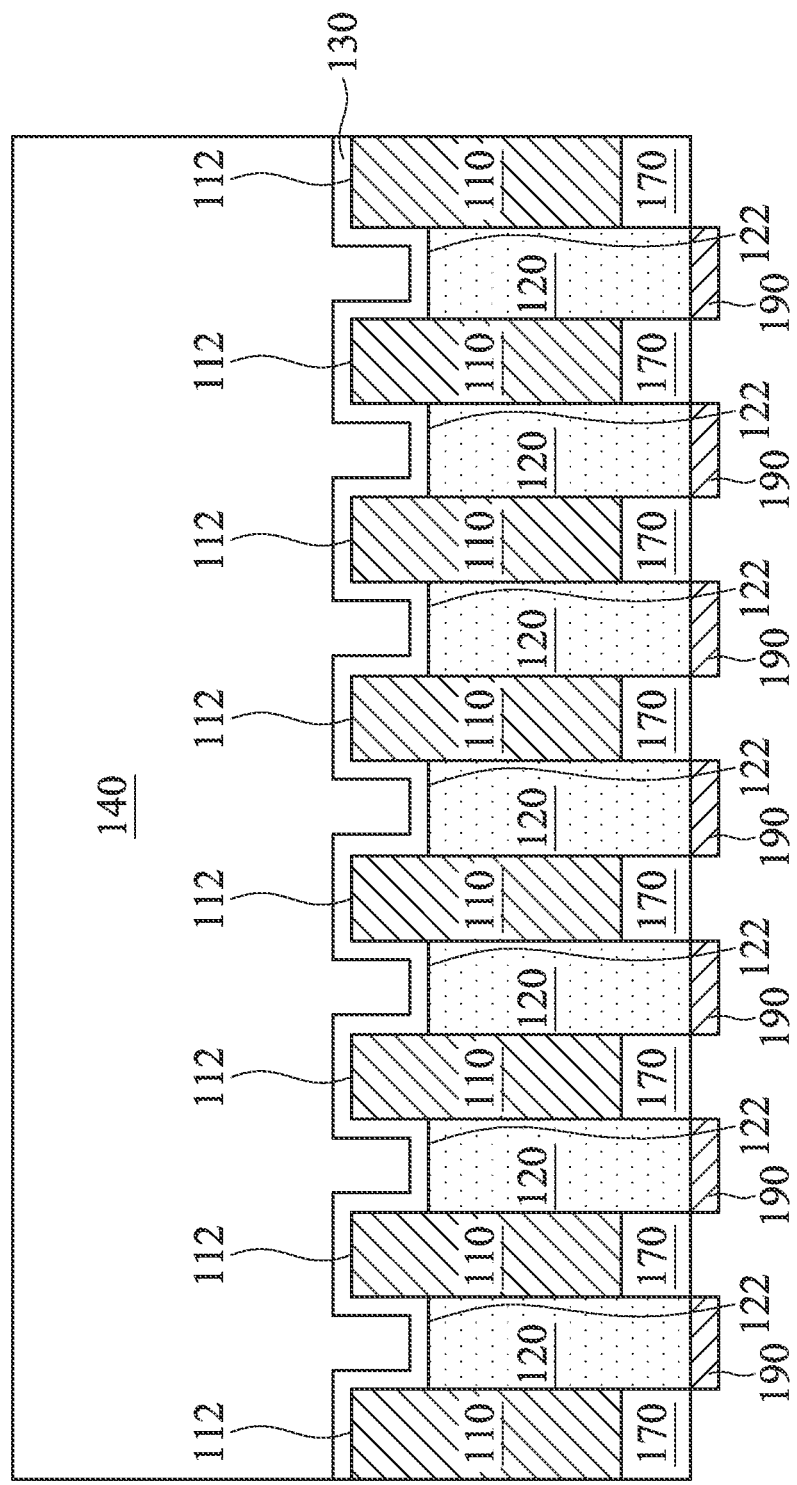

At a step 205, a second dielectric layer is formed over the etch stop layer (FIG. 2F). As illustrated in FIG. 2F, the second dielectric layer 140 is formed over etch stop layer 130. The second dielectric layer 140 can be formed in step 205 using a variety of suitable processes, including physical vapor deposition, chemical vapor deposition, electrochemical deposition, atomic layer deposition, and other suitable processes and combinations thereof. The second dielectric layer 140 can be formed in step 205 using a variety of suitable materials, including silicon dioxide, silicon oxynitride, silicon nitride, silicon carbon nitride, silicon oxycarbonitride, hafnia, tantalum nitride, and other suitable materials and combinations thereof. The second dielectric layer 140 generally provides electrical isolation between different layers of semiconductor structure 100.

Figure 2G:
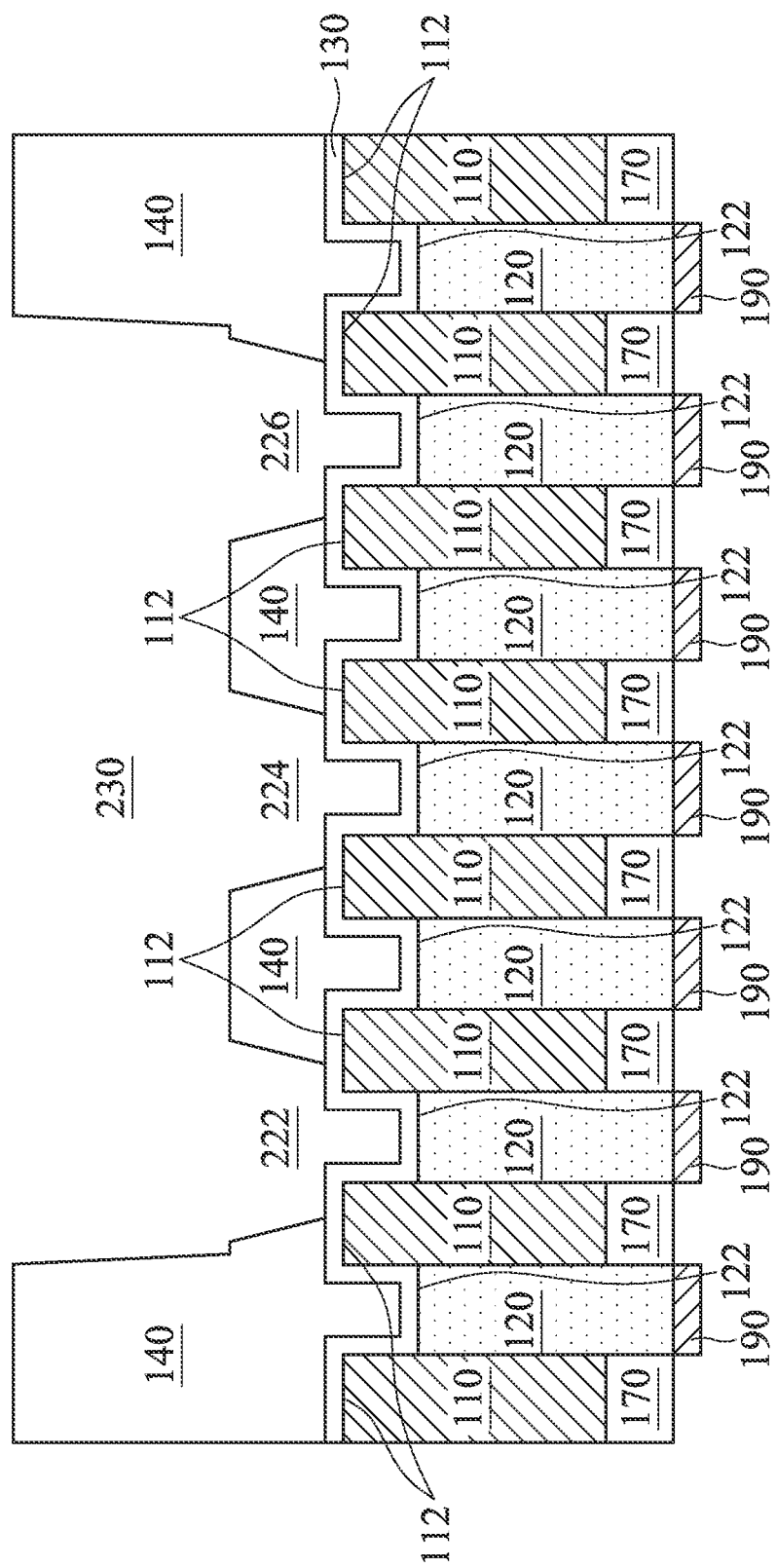

At a step 206, a portion of the second dielectric layer is removed (FIG. 2G). As illustrated in FIG. 2G, a portion of the second dielectric layer 140 is removed. In some embodiments, the portion of the second dielectric layer 140 is removed in step 206 using a dual damascene process, however other suitable processes including single damascene and other processes can be used to remove the portion of the second dielectric layer 140 in step 206. The use of a dual damascene process in step 206 can provide improvements in terms of forming a landing area for conductive via 152 and conductive via 154. As shown in FIG. 2G, as a result of step 206, a recess 222 (for conductive via 152), a recess 224 (for conductive via 154), a recess 226 (for a conductive via 156 (not shown in the cross section of FIG. 1)), and a recess 230 (for the second metal layer 160) are formed within the second dielectric layer 140. In some embodiments, additional vias are formed such that vias contact each portion of the first metal layer 120 disposed between the first dielectric layer 110. In some embodiments, the angle of the sidewalls of the first metal layer 120 are between 85 degrees and 89 degrees, however angles outside of this range are also contemplated. In some embodiments, the angle of the sidewalls of conductive via 152 and conductive via 154 are between 40 degrees and 80 degrees, however angles outside of this range are also contemplated. In some of the embodiments, upper sidewalls of the second dielectric layer 140 may be vertical, while lower sidewalls may be slanted.

Figure 2H:
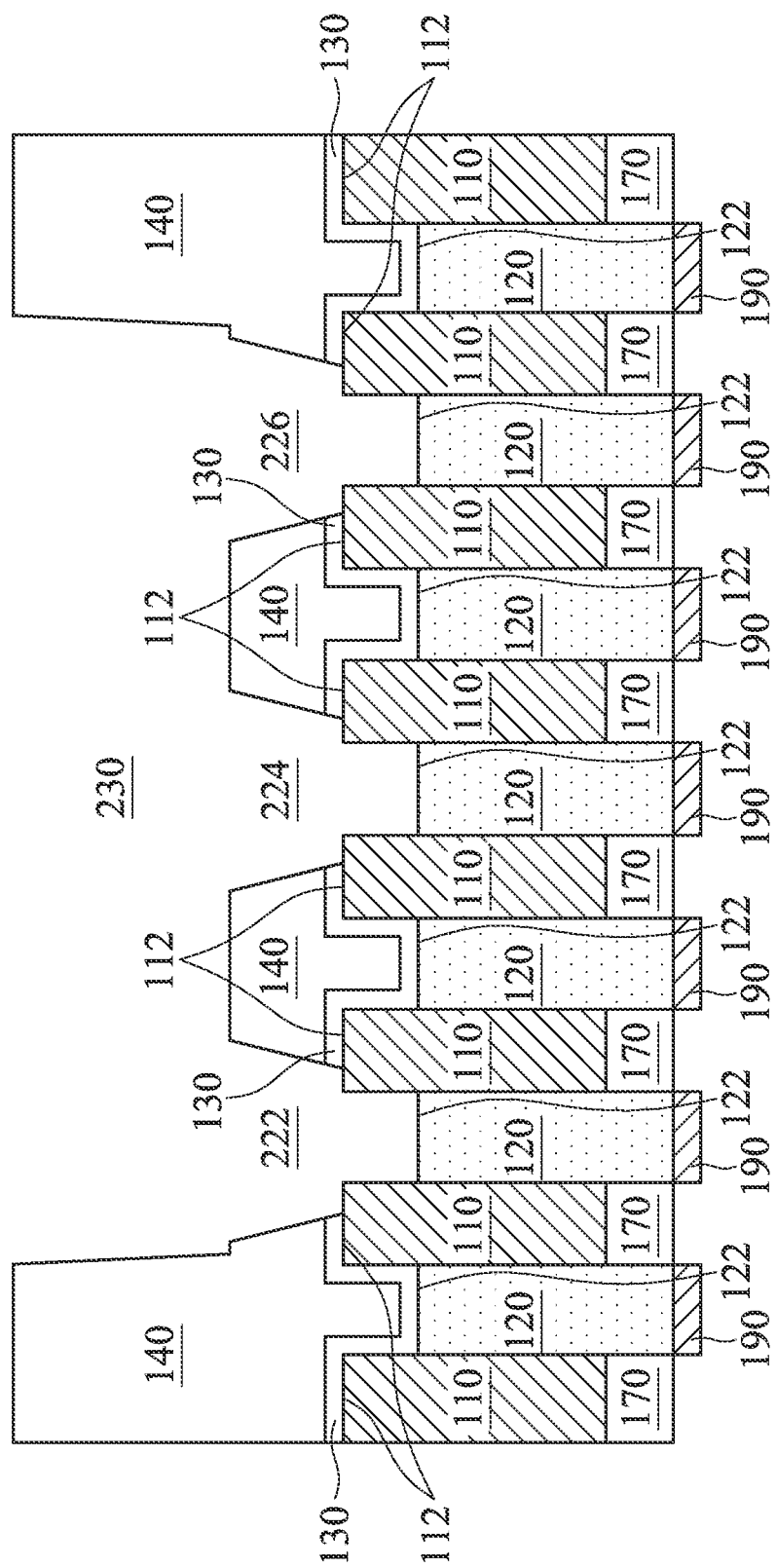

At a step 207, a portion of the etch stop layer is removed (FIG. 2H). As illustrated in FIG. 2H, a portion of etch stop layer 130 is removed. In some embodiments, the portion of etch stop layer 130 is removed in step 207 using a wet etching process, however other suitable processes including dry etching processes can also be used to remove the portion of etch stop layer 130 in step 207. The use of a wet etching process in stop 207, especially in embodiments where etch stop layer 130 is formed using aluminum oxide, can provide more clean and precise removal of etch stop layer 130 to provide a larger and more consistent landing areas for conductive via 152, conductive via 154, and conductive via 156. Accordingly, the widths of conductive via 152, conductive via 154, and conductive via 156 can be made larger and conductive via 152, conductive via 154, and conductive via 156 can have lower associated contact resistances. The angle of the sidewalls of etch stop layer 130 and the second dielectric layer 140 may be equal or different, depending on the specific materials used and the intended application.

Figure 2I:
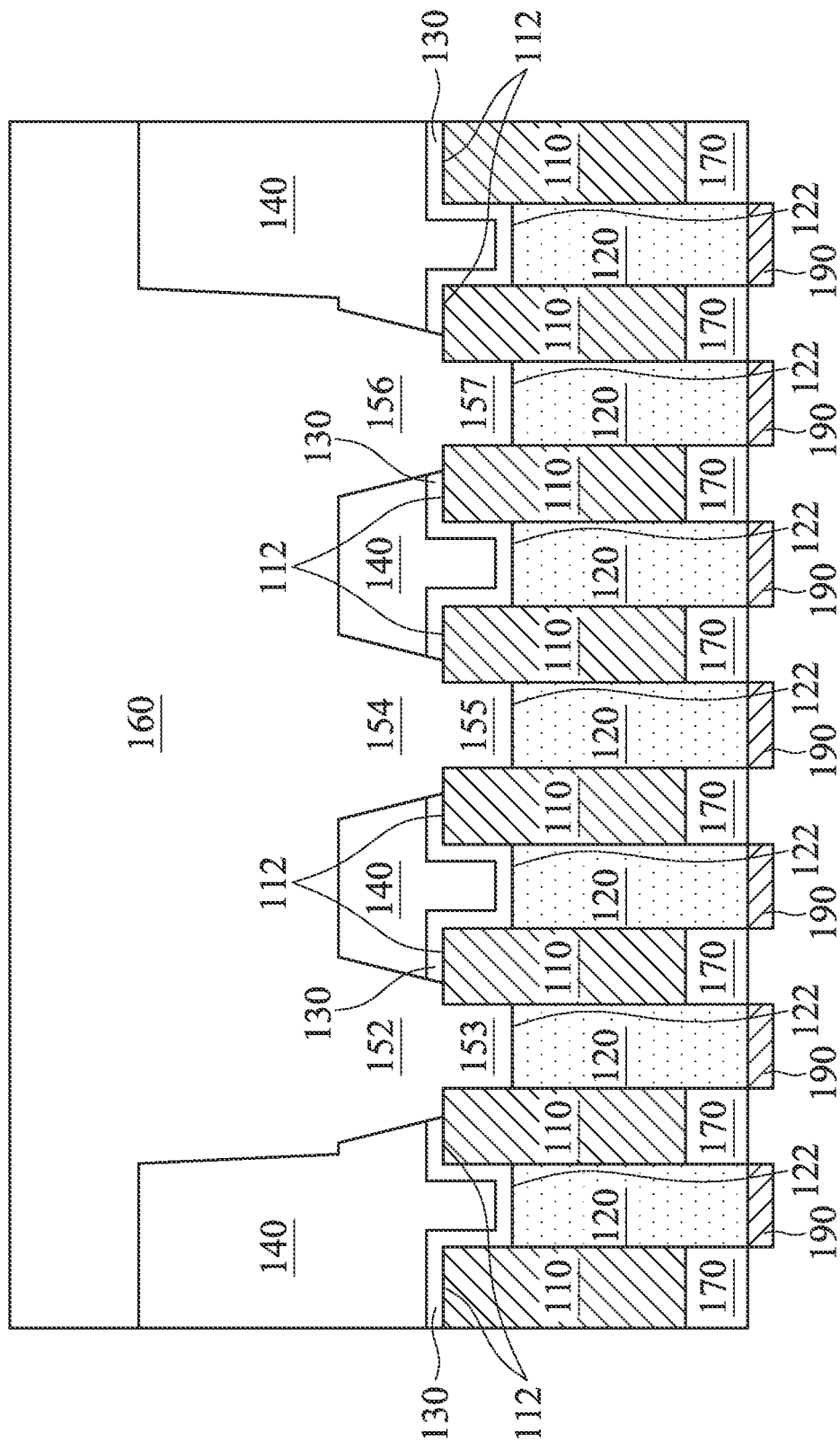

At a step 208, a conductive via and a second metal layer are formed (FIG. 2I). As illustrated in FIG. 2I, conductive via 152 and conductive via 154 are formed along with the second metal layer 160 and conductive via 156. Conductive via 152, conductive via 154, conductive via 156 (with corresponding bottom layer 157), and the second metal layer 160 can be formed in step 208 using a variety of suitable processes including a variety of suitable deposition and filing processes, including physical vapor deposition, chemical vapor deposition, electrochemical deposition, atomic layer deposition, and other suitable processes and combinations thereof. Conductive via 152, conductive via 154, conductive via 156, and the second metal layer 160 can be formed in step 208 using a variety of suitable including ruthenium, tungsten, cobalt, copper, and other suitable materials and combinations thereof.

Figure 2J:
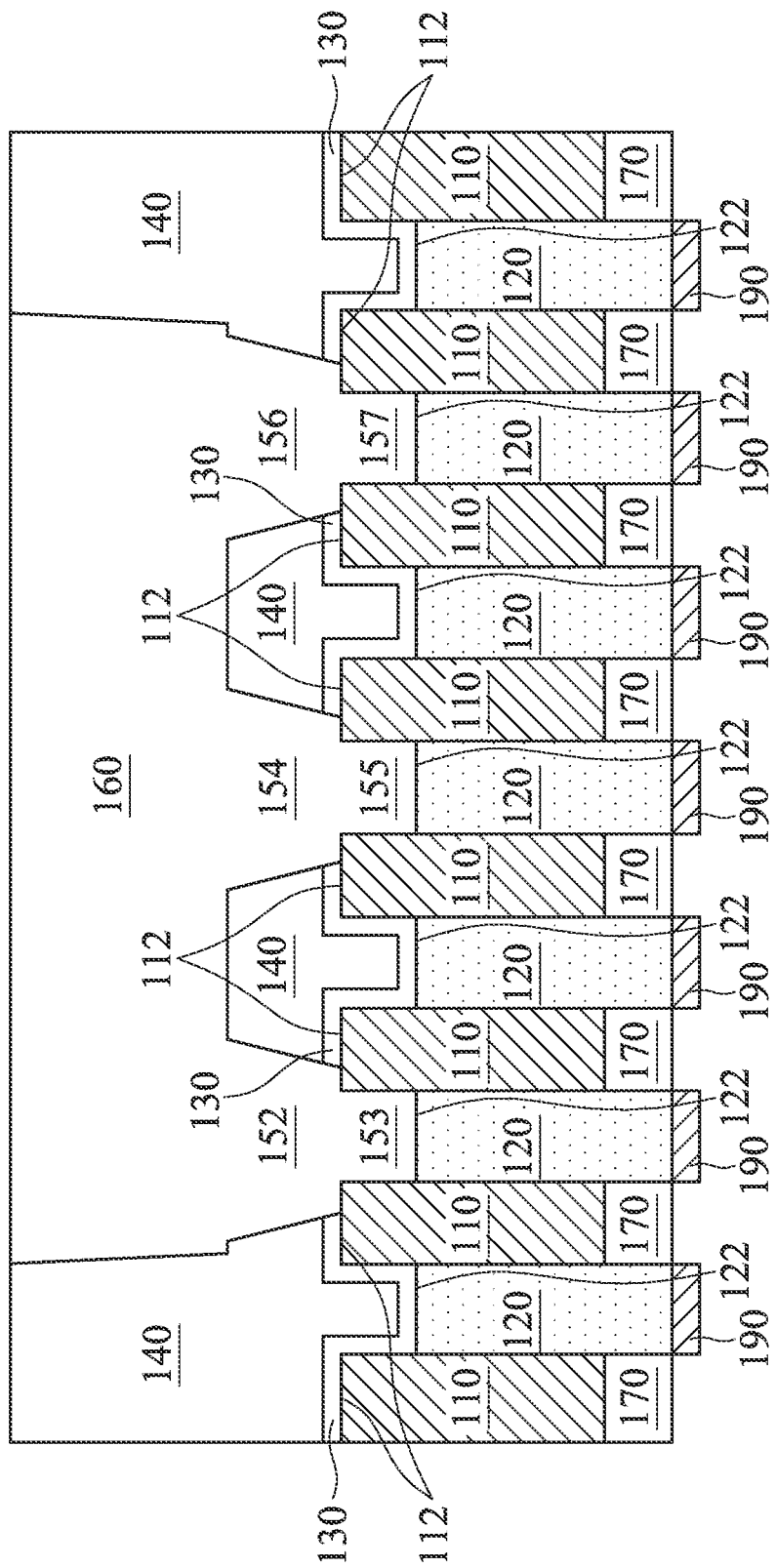

At a step 209, a portion of the second metal layer is removed (FIG. 2J). As illustrated in FIG. 2J, a portion of the second metal layer 160 is removed. The portion of the second metal layer 160 can be removed in step 209 using a variety of suitable processes including CMP and other suitable processes and combinations thereof. Step 209 generally includes removing excess material from the second metal layer 160 that extends above a top surface of the second dielectric layer 160 such that a top surface of the second metal layer 160 is even with the top surface of the second dielectric layer 140. After step 209, the fabrication process continues with formation of additional insulating and metal layers of the interconnect structure.

Figure 3:
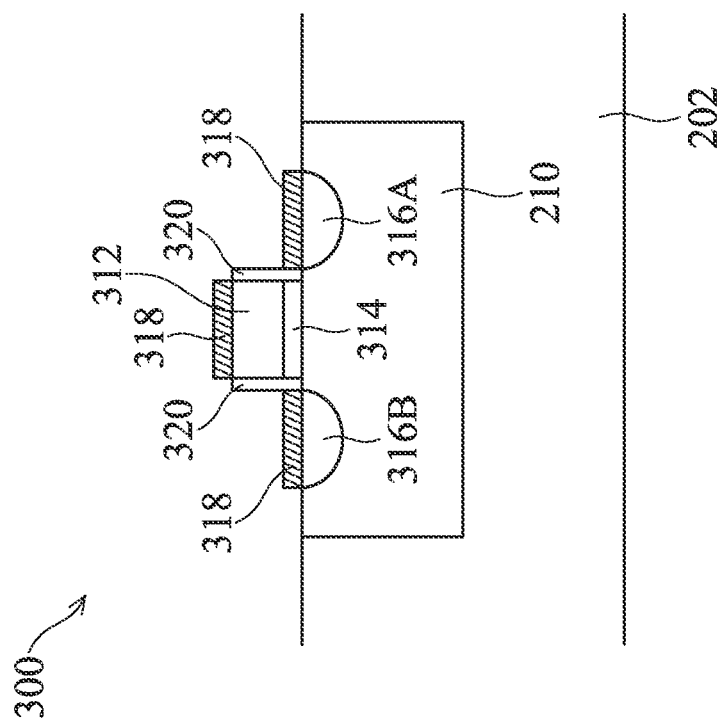
FIG. 3 illustrates a cross section of a transistor device have contacts connecting to the semiconductor structure of FIG. 1.

The contacts 190 may include, for example, gate contacts, source contacts, and/or drain contacts. FIG. 3 illustrates a transistor device 300 which may include contacts being gate contacts, source contacts, and/or drain contacts. The transistor device 300 of FIG. 3 may be a MOSFET (metal oxide semiconductor field effect transistor). The transistor device 300, however, is not limited to being a MOSFET, but may be a FinFET, a GAAFet or nanosheet FET, for example. As shown in FIG. 3, the transistor device 300, includes a well 310, gate 312 above the well 310, source 316A, drain 316B, gate oxide 314, silicide regions 318 and sidewall spacers 320. In the example where the substrate 302 is p-type doped, the well 310 may be n-type doped. As such, the transistor device 300 may be an n-type transistor. Further where the substrate 302 is n-type doped, the well 310 may be p-type doped. As such, the transistor device 300 may be a p-type transistor.

In some embodiments, the well 310 may be formed by a doping process to provide the appropriate conductivity type. The well 310 may be formed by exposing a region of the substrate 302 to dopant gas. Alternatively, the well 310 may be formed by implanting a region of the substrate 302 with dopant.

The gate 312 may be formed by depositing a gate material followed by patterning the gate material. The gate material may be, for example, polysilicon, or some other conducting material. The gate 312 may be patterned, for example, by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the gate 312. Alternatively a hard mask may be patterned, such as by a photolithographic process, and the patterned hard mask may be used as an etch mask to etch and form the gate 312. The particular etchant used will depend on the material of the gate 312. The etching process may be anisotropic, for example, such as a dry etch by reactive ion etching (RIE). The gate oxide 314 may patterned during the etch process of the gate 312.

The source 316A and drain 316B may be formed in the well 310 using the gate 312 and sidewall spacers 320 as a doping mask. For example, the well 310 may be exposed to an appropriate dopant using the gate 312 and sidewall spacers 320 as a doping mask. The source 316A and drain 316B may be formed by exposing the well 310 using a gas to provide dopant to the well 310. Alternatively, the source 316A and drain 316B may be formed by implanting the well 310 with dopant to the well 310. The source 316A and drain 316B may be doped n-type if the well is p-type. The source 316A and drain 316B may be doped p-type if the well is n-type.

The silicide regions 318 may be formed on the gate 312, the source 316A and the drain 316B to provide good electrical contact to the gate 312, the source 316A and the drain 316B. The silicide regions 318 may be formed by depositing a silicide forming metal on the gate 312, the source 316A and the drain 316B followed by heating. The silicide forming metal may be Ti or Ta, for example. Heating the silicide forming metal on the gate 312, the source 316A and the drain 316B causes the silicide forming metal to react with the gate 312, the source 316A and the drain 316B forming a silicide. After forming the silicide, the metal which has not reacted may be removed by an etch. The particular etchant will depend on the material of the silicide forming metal.

Figure 4:
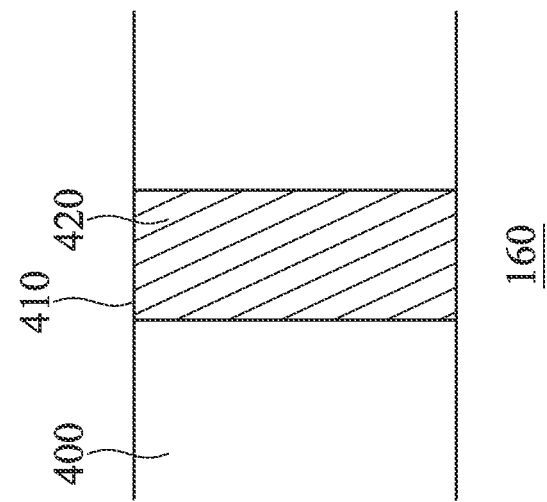
FIG. 4 illustrates a cross section of the semiconductor structure illustrating the formation of a conducting via contacting a second metal layer.

FIG. 4 illustrates a process for forming a dielectric layer 400, via opening 410 and conducting via 420 on the structure of FIG. 1 to provide electrical contact to the second metal layer 160. The dielectric layer 400 may include at least one of: silicon oxide, a comparatively low dielectric constant (k value) dielectric material with a k value less than about 4.0, or combinations thereof. In some embodiments, the dielectric layer 400 is formed of a material, including a low-k dielectric material, an extreme low-k dielectric material, a porous low-k dielectric material, or combinations thereof. The term "low-k" is intended to define a dielectric constant of a dielectric material of 3.0 or less. The term "extreme low-k (ELK)" refers to a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed by some embodiments of the present disclosure such as, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. The conducting via 420 may be formed by forming a via opening 410 in the dielectric layer 400 followed by forming a conducting material in the via opening 410. The conducting material may be tungsten, for example. The via opening 410 may be formed in the dielectric layer 400 by a lithographic process, such as photolithography, or by electron beam patterning. For the photolithographic process a photoresist material may be exposed to light through an appropriately patterned mask, and the photoresist material may be developed and patterned. The patterned photoresist may be used as an etch mask to etch and form the via opening 410 in the dielectric layer 400. The etching process may be anisotropic, for example, such as a dry etch by RIE.

Once the via opening 410 is formed, the conducting material, such as tungsten, may be formed in the via opening 410 to form the conducting via 420. The conducting material may then be polished, for example, by chemical mechanical polishing (CMP) to remove the conducting material from a top of the dielectric layer 400 to leave the conducting material only in the via opening 410. In FIG. 4, the conducting via 420 electrically contacts the second metal layer 160.

It will be appreciated that semiconductor structure 100 and process 200 are provided as example implementations, and those skilled in the art will understand that various adaptations to both semiconductor structure 100 and process 200 are contemplated within the scope of the present disclosure. For example, the recess formed in step 203 can be formed deeper or shallower, can be formed only in certain areas of the first metal layer 120, and can be formed of differing geometries depending on the intended application. Further, the techniques discussed herein can be applied in various areas of an integrated circuit or other electronic components more generally. Further, it will be appreciated that various additional materials and layers not explicitly shown in the figures, such as additional insulating layer, etch stop layers, barrier layers, and other layers can be included depending on the intended application.

As described in detail above, the present disclosure provides a semiconductor structure and method of fabricating a semiconductor structure includes formation of a recess in a metal layer during the fabrication process to provide process improvements and a conductive via with reduced contact resistance. The semiconductor structure includes a dielectric layer, a metal layer, an etch stop layer, and a conductive via. The top surface of the dielectric layer extends above a top surface of the metal layer, and a bottom surface of the conductive via extends below the top surface of the dielectric layer. The etch stop layer can be formed using a thin layer of aluminum oxide and can be partially removed using a wet etching process during the fabrication process. The techniques discussed in the present disclosure can be used to reduce variations in the widths of conductive vias and to enlarge the widths of conductive vias, as well as to control overlap. Further, the techniques discussed herein can be used to provide reduced contact resistance associated with conductive vias as a result of improved landing control of conductive vias, as well as to control metal leak space. The techniques discussed herein can be especially useful in applications with smaller semiconductor devices, such as applications where the pitch is less than 20 nanometers.

An implementation of the present disclosure is semiconductor structure. The semiconductor structure includes a dielectric layer, a metal layer formed adjacent the dielectric layer, and an etch stop layer formed on a top surface of the dielectric layer and on a top surface of the metal layer. The top surface of the dielectric layer extends above the top surface of the metal layer.

Another implementation of the present disclosure is a method of fabricating a semiconductor structure. The method includes forming a recess in a metal layer adjacent a dielectric layer, forming an etch stop layer over the metal layer, within the recess, and over the dielectric layer, removing a portion of the etch stop layer formed within the recess, and forming a conductive via adjacent the metal layer and within the recess.

Yet another implementation of the present disclosure is another semiconductor structure. The semiconductor structure includes a dielectric layer, a metal layer formed adjacent the dielectric layer, and a conductive via formed adjacent the metal layer such that a bottom surface of the conductive via is adjacent a top surface of the metal layer. The bottom surface of the conductive via extends below a top surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first dielectric layer;
a metal layer formed adjacent the first dielectric layer;
a contact contacting a bottom surface of the metal layer;
an etch stop layer formed on a top surface of the first dielectric layer and on a top surface of the metal layer, the etch stop layer extending over an entirety of a top surface of a first portion of the first dielectric layer and only partially extending over a top surface of a second portion of the first dielectric layer, the first and second portions of the first dielectric layer being separated by the metal layer; and
a second dielectric layer including a first portion over a top surface of the etch stop layer and a second portion along sidewalls of the first dielectric layer,
wherein the second dielectric layer is a single, continuous layer extending from the first portion to the second portion, and
wherein the top surface of the first dielectric layer extends above the top surface of the metal layer.

2. The semiconductor structure of claim 1, further comprising a conductive via formed adjacent the first dielectric layer and the metal layer, wherein a bottom surface of the conductive via extends below the top surface of the first dielectric layer.

3. The semiconductor structure of claim 2, further comprising a second metal layer over and electrically connected to the conductive via.

4. The semiconductor structure of claim 1, wherein the top surface of the first dielectric layer extends above the top surface of the metal layer by a magnitude ranging from 2 nanometers to 10 nanometers.

5. The semiconductor structure of claim 1, wherein the etch stop layer includes aluminum oxide.

6. The semiconductor structure of claim 1, wherein a thickness of the etch stop layer ranges from 1 nanometer to 15 nanometers.

7. The semiconductor structure of claim 1, wherein the second dielectric layer is surrounded by a bottom surface and sidewall surfaces of the etch stop layer.

8. The semiconductor structure of claim 1, wherein the first metal layer directly contacts the contact.

9. A semiconductor structure, comprising:
a first dielectric layer;
a first metal layer formed adjacent the first dielectric layer;
a conductive via formed adjacent the first metal layer such that a bottom surface of the conductive via is adjacent a top surface of the first metal layer, a bottom portion of the conductive via directly contacting sidewalls of the first dielectric layer and a top surface of the first metal layer;
a second metal layer formed in the conductive via; and
a second dielectric layer formed over the first metal layer, wherein a first portion of the second dielectric layer extends along sidewalls of the first dielectric layer and a second portion of the second dielectric layer extends along sidewalls of the second metal layer, the second dielectric layer extending from the first portion to the second portion as a single, continuous layer, wherein a bottom surface of the second metal layer extends below a top surface of the first dielectric layer, and wherein a top surface of the second metal layer extends above the second dielectric layer.

10. The semiconductor structure of claim 9, wherein the top surface of the first dielectric layer extends above the top surface of the first metal layer.

11. The semiconductor structure of claim 9, further comprising an etch stop layer formed on the top surface of the first dielectric layer and the first metal layer, wherein the etch stop layer is formed using aluminum oxide and a thickness of the etch stop layer ranges from 1 nanometer to 15 nanometers.

12. The semiconductor structure of claim 9, wherein the bottom surface of the second metal layer extends below the top surface of the first dielectric layer by a magnitude ranging from 2 nanometers to 10 nanometers.

13. The semiconductor structure of claim 9, further comprising contacts contacting the first metal layer.

14. A semiconductor structure, comprising:
a first dielectric layer;
a first metal layer formed adjacent the first dielectric layer;
a contact contacting a bottom surface of the first metal layer;
a second metal layer contacting top regions of the first metal layer;
an etch stop layer formed on a top surface of the first dielectric layer and on a top surface of the first metal layer, the etch stop layer including a first portion that fully covers a top surface of a first portion of the first dielectric layer and a second portion that only partially covers a top surface of a second portion of the first dielectric layer, the first and second portions of the first dielectric layer being separated by the first metal layer; and a second dielectric layer over the first metal layer, the second dielectric layer including a first portion over a top surface of the etch stop layer and a second portion below the top surface of the etch stop layer, the second dielectric layer extending from the first portion to the second portion as a single, continuous layer, wherein a bottom surface of the second dielectric layer extends below the top surface of the first dielectric layer, wherein the top surface of the first dielectric layer extends above the top surface of the first metal layer.

15. The semiconductor structure of claim 14, wherein the top surface of the first dielectric layer extends above the top surface of the first metal layer by a magnitude ranging from 2 nanometers to 10 nanometers.

16. The semiconductor structure of claim 14, wherein the etch stop layer includes aluminum oxide.

17. The semiconductor structure of claim 14, wherein a thickness of the etch stop layer ranges from 1 nanometer to 15 nanometers.

18. The semiconductor structure of claim 14, wherein the second portion of the second dielectric layer is surrounded by a bottom surface and sidewall surfaces of the etch stop layer.

19. The semiconductor structure of claim 14, further comprising a conductive via formed adjacent the first metal layer such that a bottom surface of the conductive via directly contacts the first metal layer.

20. The semiconductor structure of claim 19, further comprising a second metal layer formed over and electrically connected to the conductive via.

* * * * *